(12) United States Patent  
Chubun

(10) Patent No.: US 7,573,046 B1  
(45) Date of Patent: Aug. 11, 2009

(54) THERMAL FIELD EMISSION ELECTRON GUN WITH REDUCED ARCING

(75) Inventor: Nikolai N. Chubun, Palo Alto, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 245 days.

(21) Appl. No.: 11/728,664

(22) Filed: Mar. 26, 2007

(51) Int. Cl.
*H01J 37/141* (2006.01)

(52) U.S. Cl. .................. 250/423 F; 315/1; 315/94

(58) Field of Classification Search .......... 250/423 F, 250/427, 426, 310; 315/1, 94
See application file for complete search history.

(56) References Cited

U.S. PATENT DOCUMENTS

| | | | |
|---|---|---|---|
| 4,453,078 A * | 6/1984 | Shimizu | 250/425 |
| 5,041,732 A * | 8/1991 | Saito et al. | 250/396 ML |
| 5,059,792 A | 10/1991 | Kaga | |
| 5,177,402 A * | 1/1993 | Howard et al. | 315/1 |
| 5,536,944 A | 7/1996 | Tsunoda et al. | |
| 5,698,855 A | 12/1997 | Kaihara | |
| 5,962,961 A | 10/1999 | Sakai et al. | |

* cited by examiner

*Primary Examiner*—Kiet T Nguyen
(74) *Attorney, Agent, or Firm*—Okamoto & Benedicto LLP

(57) ABSTRACT

One embodiment relates to a thermal field emission electron gun. The electron gun includes a high-vacuum chamber, a thermal field emission cathode including a filament and a tip, a suppressor electrode, an extraction electrode, and a high-voltage power source. The high-voltage power source is coupled to the filament and to the suppressor and extraction electrodes such that the suppressor electrode is at a negative voltage potential in relation to the filament and the extraction electrode is at a positive voltage potential in relation to the filament. A current-limiting resistor is electrically coupled in series with the suppressor electrode. Applicant has determined that such a current-limiting resistor substantially reduces undesirable discharges and improve the reliability and lifetime of the electron gun. Other embodiments, aspects and features are also disclosed.

11 Claims, 6 Drawing Sheets

THERMAL FIELD EMISSION ELECTRON GUN WITH REDUCED ARCING

BACKGROUND OF THE INVENTION

1. Technical Field

The present disclosure relates to thermal field emission electron guns and methods for making and using same.

2. Description of the Background Art

A thermal field emission electron gun comprises an emitter tip that is heated by electric current and has applied electric field causing emission of electrons from the tip. Such an electron gun may be used in scanning electron microscopes and other similar instrumentation.

Cathode tip damage by arcing is the most frequent cause of electron gun failure. Arc events may occur during manufacture of the electron gun, during the first few weeks of field application of the electron gun, as well as during the rest of its operational lifetime. Most electron guns returned from the field failed due to arcing well before exhaustion of the potential lifetime of the gun. In practice, the useful lifetimes of such electron guns are typically limited by arcing from the emitter tip. This results in an undesirably frequent need for electron gun replacement.

Multiple previous improvements in materials and technology did not eliminate or sufficiently reduce the risk of arcing. It is desirable to improve the reliability and useful lifetimes of emitter tips in thermal field emission electron guns.

SUMMARY

One embodiment relates to a thermal field emission electron gun. The electron gun includes a high-vacuum chamber, a thermal field emission cathode including a filament and tip, a suppressor electrode, an extraction electrode, and a high-voltage power source. The high-voltage power source is coupled to the filament and to the suppressor and extraction electrodes such that the suppressor electrode is at a negative electric potential in relation to the tip and the extraction electrode is at a positive voltage potential in relation to the tip. A current-limiting resistor is electrically coupled in series with the suppressor electrode. Applicant has determined that such a current-limiting resistor substantially reduces undesirable discharges and improve the reliability and lifetime of the electron gun.

Other embodiments, aspects and features are also disclosed.

DETAILED DESCRIPTION

Figure 1:
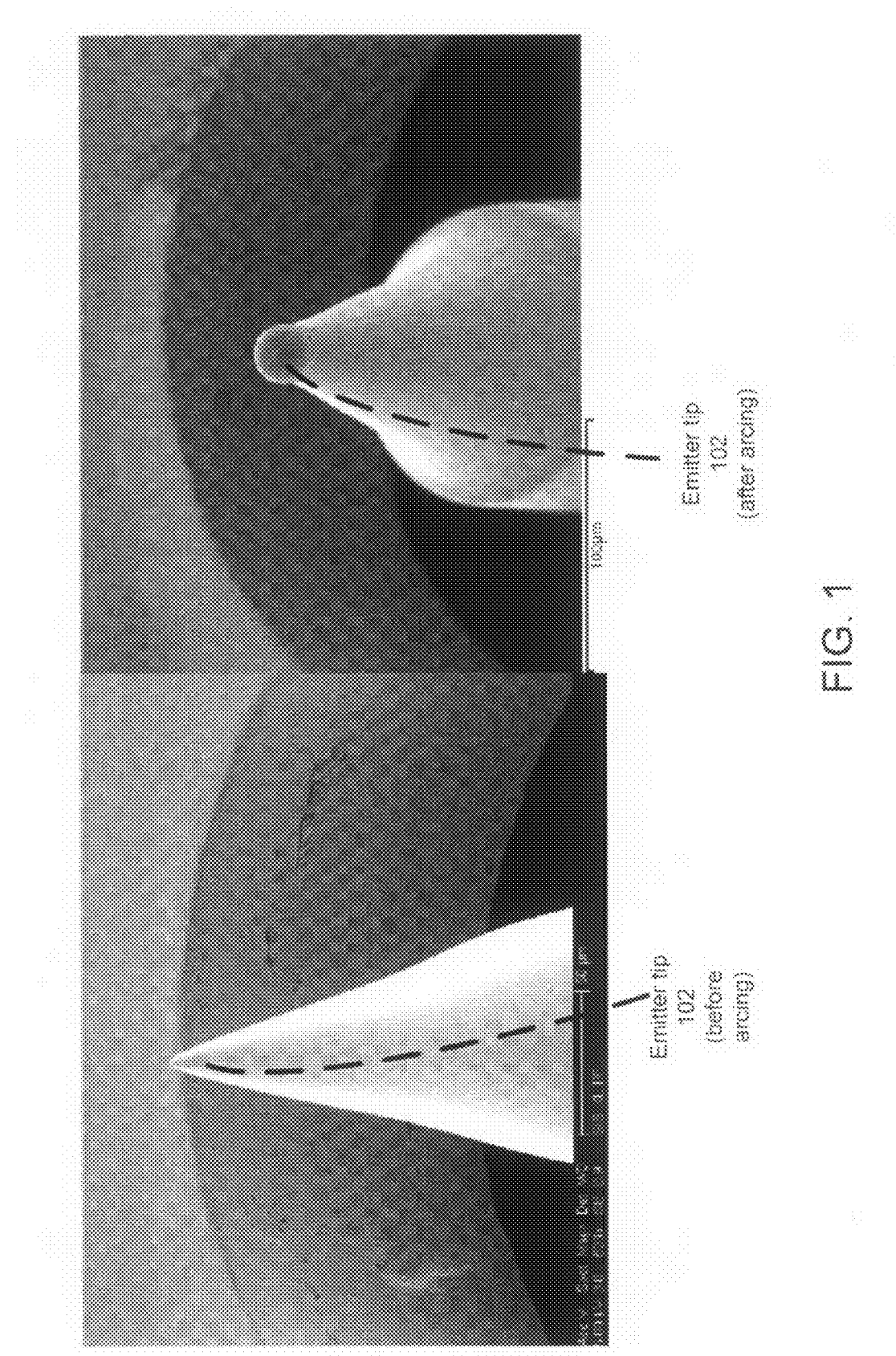
FIG. 1 is a photomicrograph showing a magnified view of an actual emitter tip which has been damaged due to arcing.

FIG. 1 is a photomicrograph showing an actual emitter tip 102 which has been damaged due to arcing caused melting at the apex of the tip. As shown, the apex of the tip is no longer sharp after being melted. As discussed herein, such melting of the apex of the emitter tip is typically caused by arcing between the emitter tip and the extractor electrode and results in the need to replace the emitter tip.

Figure 2A:
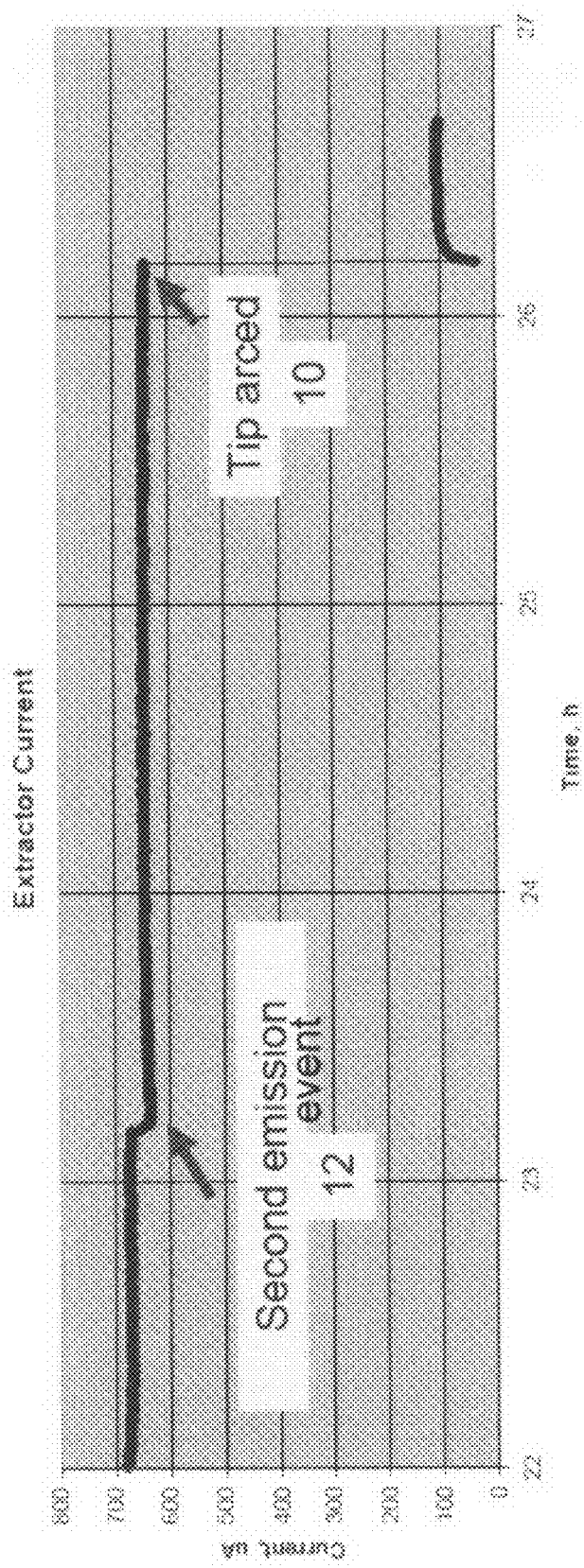
FIG. 2A is a graph showing observed extractor current versus time during a time period including a tip arcing event for a conventional thermal field emission gun.

FIG. 2A is a graph showing observed extractor current versus time during a time period including a tip arcing event for a conventional thermal field emission gun. As shown, in this particular example, there is a dramatic drop in extractor current after 26 hours of operation. In this particular example, the extractor current drops from about 650 microamperes to about 100 microamperes. Applicant has identified this drop with an emitter tip arcing event 10. After the tip arcing 10 (the main arcing event), the apex of the emitter tip is melted, and so the emitter typically needs replacement. As discussed above, an example of an emitter tip after arcing is shown visually in FIG. 1.

In the observed extractor current shown in FIG. 2A, applicant points out an emission event (the "second emission event") 12 occurring after 23 hours of operation and prior to the tip arcing event 10. This emission event 12 is observed by a drop in extractor current from about 680 microamperes to about 650 microamperes.

Figure 2B:
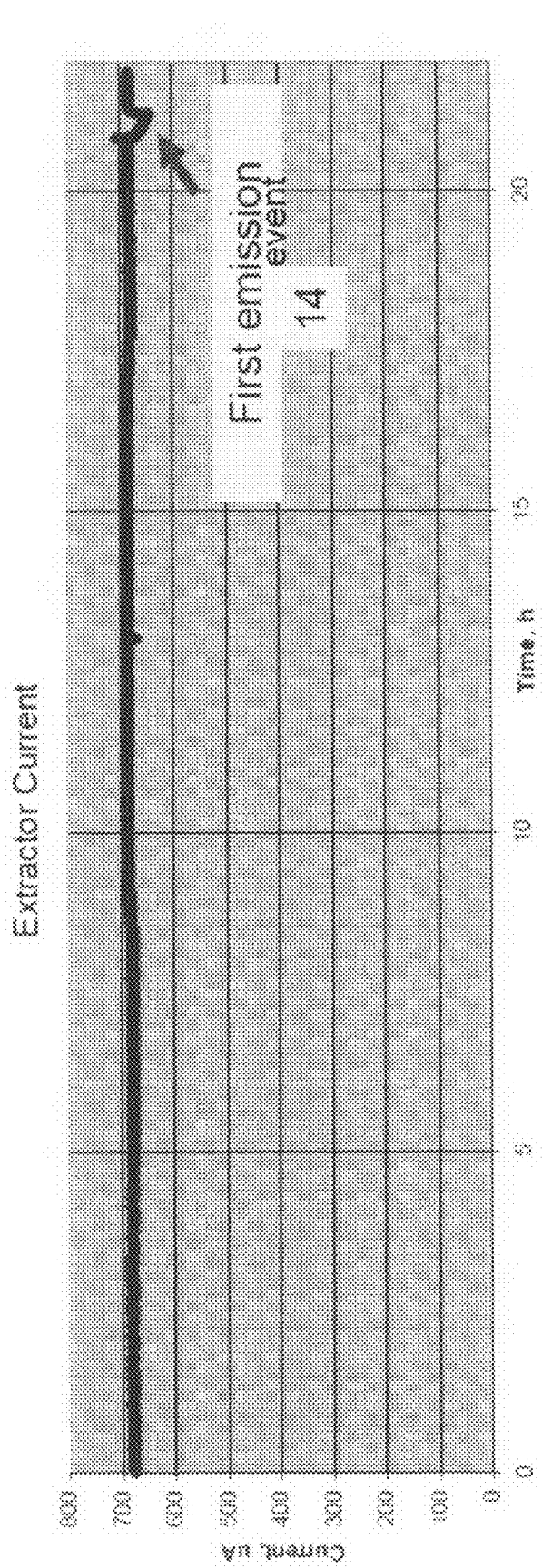
FIG. 2B is a graph showing observed extractor current versus time during an earlier time period before the tip arcing event for a conventional thermal field emission gun.

In this particular example, an even earlier emission event (the "first emission event") 14 is shown in FIG. 2B. This emission event 14 is a transient event that occurs at approximately 21 hours of operation.

Applicant has identified such emission events (for example, 12 and 14) occurring before the tip arcing event 10 as preliminary causes of the tip arcing. As discussed below, applicant has further identified what is believed to be the source of these preliminary emission events (for example, 12 and 14).

Figure 3:
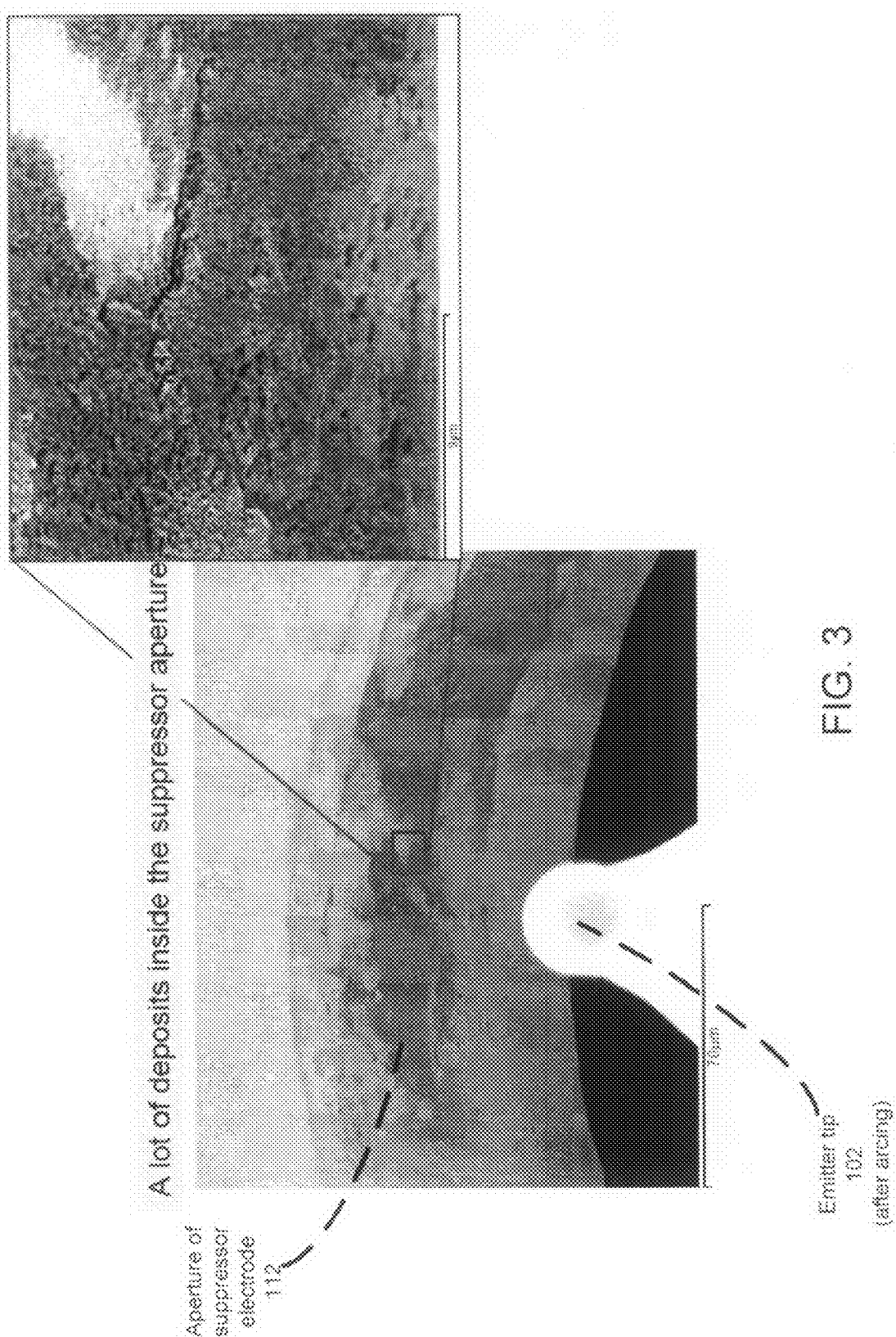
FIG. 3 is a photomicrograph showing observed deposits inside the suppressor aperture of a conventional thermal field emission electron gun.

FIG. 3 is a photomicrograph showing observed deposits inside the suppressor aperture 112 of a conventional thermal field emission electron gun. The emitter tip 102 with melted apex is shown for reference. As seen in FIG. 3, there is observed a substantial amount of deposits inside the suppressor aperture 112 for the particular thermal field emission electron gun. An expanded view of a portion of the suppressor aperture 112 with visible deposits is also shown in FIG. 3.

Applicant has come to the conclusion that these deposits are related to preliminary emission events (i.e. 12 and 14) discussed above in relation to FIGS. 2A and 2B. These emission events appear to be caused by arcing from the suppressor electrode 112 to the extraction electrode 114 and/or the emitter tip 102. Applicant further believes that eliminating or reducing these emission events should improve the reliability and useful lifetimes of emitter tips for thermal field emission electron guns.

The present application discloses an improvement to a conventional thermal field emission electron gun which applicant has determined does effectively reduce the above-discussed preliminary emission events (arcing). Conventional designs do not have sufficient protection from random high-voltage vacuum discharge, which may be initiated by various causes, including, but not limited to, uncontrollable field emission from electrodes, insulator flash over, short-time out-gassing bursts from a material, and ion pump spikes. As described further below, applicant has determined that a current-limiting resistor may be advantageously installed in series with the suppressor electrode so as to effectively reduce such discharges.

Figure 4:
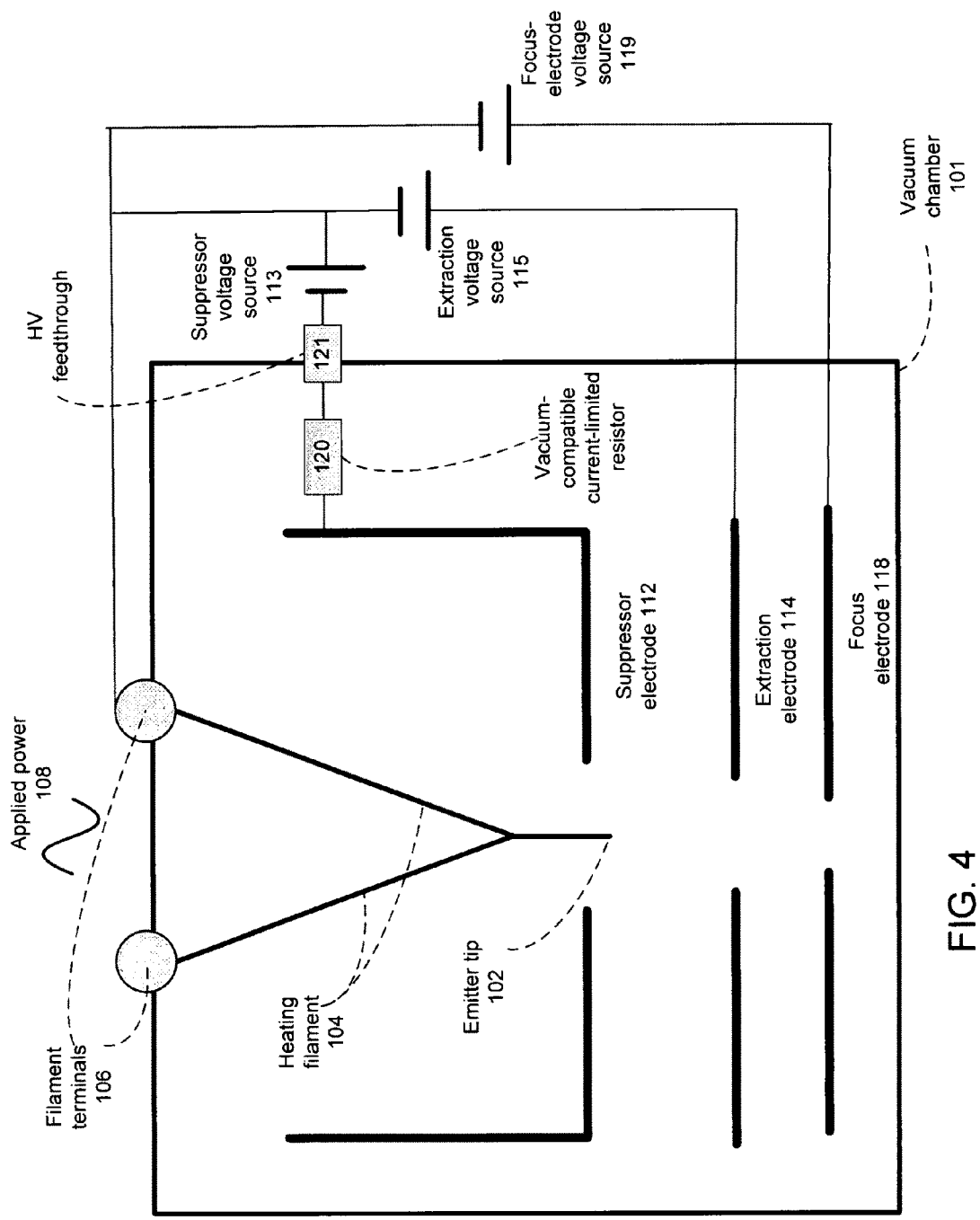
FIG. 4 is a schematic diagram of a thermal field emission electron gun as modified in accordance with an embodiment of the invention.

FIG. 4 is a schematic diagram of a thermal field emission electron gun as modified in accordance with an embodiment of the invention. Certain components are positioned in a vacuum chamber 101, including the thermal field emitter tip 102, heating filament 104 coupled to the tip, a suppressor electrode 112, an extraction electrode 114, and a focus electrode 118, among other components. Other components include, for example, ceramic elements under high electric field strengths for electrode-to-electrode isolation. The vacuum chamber 101 is typically held at ultra high vacuum.

Power 108 is applied between two filament terminals 106 by a power supply outside the vacuum chamber 101. The applied power 108 is conducted via the heating filament 104. The conductive elements 104 may comprise, for example, solid Tungsten wire.

In addition, a voltage difference is applied using the suppressor voltage source 113 between the suppressor electrode 112 and filament terminals 106. The suppressor voltage source 113 is outside the vacuum chamber 101. This voltage difference is applied such that the suppressor electrode 112 is held at a negative potential relative the emitter tip 102. This negative potential difference provides an electrostatic force that generally repels electrons from the emitter tip 102 away from the suppressor electrode 112. For example, the negative potential difference may be up to one kilovolt (−1 kV). Other suppressor voltage differences may be used.

Further, a voltage difference is applied using the extraction voltage source 115 between the extraction electrode 114 and one of the filament terminals 106. The extractor voltage source 115 is also outside the vacuum chamber 101. This voltage difference is applied such that the extraction electrode 114 is held at a positive potential relative the emitter tip 102. This positive potential difference provides an electrostatic force that generally extracts electrons from the emitter tip 102 towards an aperture of the extraction electrode 114. For example, the positive potential difference may be up to seven kilovolts (+7 kV). Other extraction voltage differences may be used.

These extracted electrons subsequently form an electron beam that is generated by the electron gun. For example, the electron beam may be further accelerated through a focus electrode 118 and controllably deflected for use in a scanning electron microscope. For example, the focus electrode 118 may be at a voltage that up to twenty kilovolts (+20 kV) higher than the emitter tip, as applied by a focus-electrode voltage source 119 which is also outside the vacuum chamber 101. Other focusing voltage differences may be used.

Connection to the electron gun from the above-described power/voltage sources is typically made using a high voltage cable. The high voltage cable generally has a not insignificant capacitance.

The high electric field strengths (produced by the high voltage differences) is generally necessary for operation of the thermal field emission cathode. Unfortunately, under those conditions, electrical breakdown (i.e. arcing) across a narrow vacuum gap or over an insulator is a relatively common phenomenon.

In particular, as discussed above, a major arcing event from the emitter tip 102 to the extraction electrode 114 commonly occurs to melt the apex of the emitter tip 102 such that a new tip is needed. This undesirably limits the reliability and useful lifetime of emitter tips.

As further discussed above, applicant has determined that emission events prior to the main arcing event appear to be a preliminary cause of the main arcing event or to make such a main arcing event more likely. In other words, applicant has determined that prevention of such prior emission events appear to make the main arcing event less likely or delayed.

In accordance with one embodiment of the invention, to effectively reduce or prevent the above-discussed preliminary emission events (arcing) from the suppressor electrode 112 to the extraction electrode 114 and/or the emitter tip 102, applicant has configured a current-limiting resistor 120 within the vacuum chamber 101. The current-limiting resistor 120 is installed in series with the suppressor electrode 112. The current-limiting resistor 120 limits power delivery from the suppressor voltage source 113 to the suppressor electrode 112 to prevent arcing from the suppressor electrode 112. Without such a current-limiting resistor 120, an undesirably high current can be delivered from the suppressor voltage source 113 to the suppressor electrode 112, allowing an arcing event propagate from the suppressor electrode 112 to the extraction electrode 114 and/or the emitter tip 102.

In a preferred embodiment of the invention, the current-limiting resistor 120 has a resistance in a range from 100 kiloOhms to 100 megaOhms. In one specific implementation, a preferred value is 1 megaOhm. The preferred value depends on the specific designs of the electron gun, power source, and high-voltage cable.

Although such a current-limiting resistor 120 may, in theory, be placed inside or outside of the vacuum chamber 101. Applicant has determined that placement outside of the vacuum chamber 101 is not preferable given the capacitance of the high-voltage cable and/or of the high-voltage feed through 121 from the power supplies to the electron gun. The high-voltage feed through 121 couples to the high-voltage cable and feeds the high voltages from outside to within the vacuum chamber 101.

Hence, applicant has determined that placement of the current-limiting resistor 120 is preferably inside of the vacuum chamber 101 of the electron gun. This placement provides superior protection from arcing because it excludes from the arc energy balance the capacity of the power source, high-voltage cable, and high-voltage feed through 121. With such a placement inside of an ultra high-vacuum environment, the current-limiting resistor 120 should be implemented so as to not have out-gassing and also to be relatively stable under baking out of the gun and under long-term use within the ultra high-vacuum environment.

In one implementation, such a vacuum-compatible current-limiting resistor 120 may be implemented using a glass encapsulated resistor. In another implementation, such a vacuum-compatible current-limiting resistor 120 may be implemented using an uncoated ceramic type of current-limiting resistor. The uncoated ceramic type of current-limiting resistor comprises a ceramic rod having a surface with resistive material thereon and metal terminals.

As discussed above in relation to FIG. 3, without such a current-limiting resistor 120, arcing appears to commonly occur between the aperture of the suppressor electrode 112 and either the emitter tip 102 or the extractor electrode 114.

Figure 5:
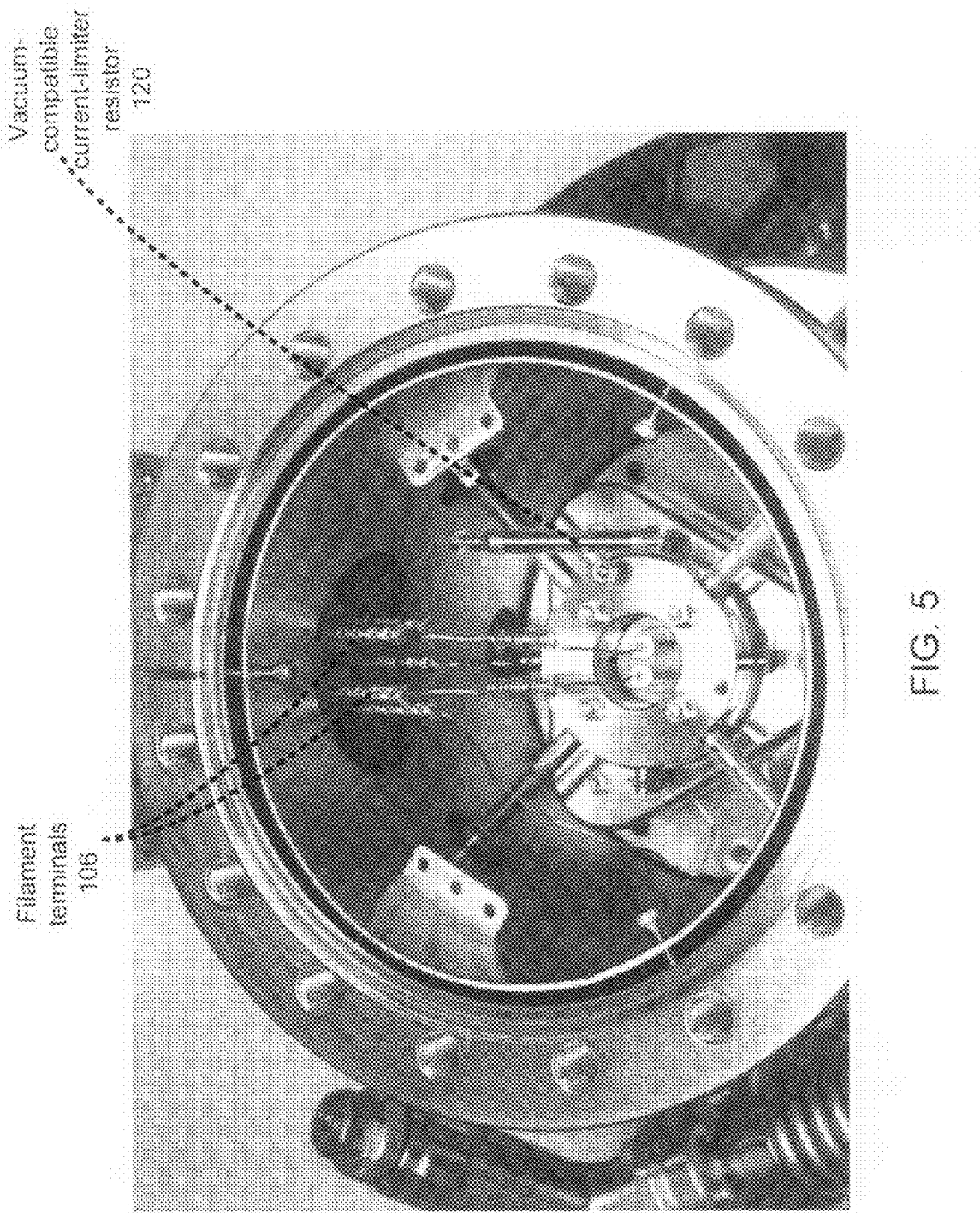
FIG. 5 is a photograph showing a vacuum-compatible resistor positioned as part of a thermal field emission electron gun in accordance with an embodiment of the invention.

FIG. 5 is a photograph showing a current-limiting resistor 120 positioned as part of a thermal field emission electron gun in accordance with an embodiment of the invention. In this specific implementation, the current-limiting resistor 120 is made vacuum compatible by glass encapsulation. Other specific implementations may be utilized.

During normal operation of the electron gun, the suppressor electrode 112 does not have any electrical current passing through, so there is no restriction based on the current-limiting resistor 120 dissipating power and on voltage drop across the resistor.

During a short pulse arc event from the suppressor electrode 112, an arc current would cause a voltage drop on the current-limiting resistor 120 which is configured in series. Hence, the current-limiting resistor 120 may be rated for a breakdown voltage from hundreds to several kilovolts in dependence on the gun specification. Experimentally, applicant has determined that a glass encapsulated resistor rated for one thousand (1000) volts and ceramic resistors in a breakdown voltage range of 500 to 4,500 volts may be used.

One alternative embodiment involves placing the current-limiting resistor 120 outside the vacuum chamber 101 between the high-voltage cable and the high-voltage feed through. This would protect the suppressor electrode from energy stored in the capacitance of the high-voltage cable, but would not protect the suppressor electrode from energy stored in the capacitance of the high-voltage feed through 121.

Another alternative embodiment involves using a resistive high-voltage cable core (an electrical cable with distributed electrical resistance). Such a cable may be made with a resistance equivalent to a lumped resistor between the cable and the feed through 121, but may have an advantage of having distributed resistance and a higher breakdown voltage.

Another alternative embodiment involves placing the current-limiting resistor 120 inside the high-voltage suppressor power source 113. However, in that case, some significant energy stored in the high-voltage cable could still be involved in an arcing event.

Yet another embodiment may involve using two inductive elements, one inserted in series with each wire 104 of the tip heater filament.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. A thermal field emission electron gun comprising:
a high-vacuum chamber;
a thermal field emission cathode including a tip and a filament within the high-vacuum chamber;
a suppressor electrode within the high-vacuum chamber;
an extraction electrode within the high-vacuum chamber;
a high-voltage power source apparatus coupled to the filament and to the suppressor and extraction electrodes such that the suppressor electrode is at a negative voltage potential in relation to the filament and the extraction electrode is at a positive voltage potential in relation to the filament; and
a current-limiting resistor electrically coupled in series with the suppressor electrode,
wherein the current-limiting resistor is a vacuum-compatible resistor positioned within the high-vacuum chamber.

2. The thermal field emission electron gun of claim 1, wherein the vacuum-compatible resistor comprises a glass-encapsulated or uncoated ceramic resistor.

3. The thermal field emission electron gun of claim 1, wherein the current-limiting resistor has a resistance in a range of 100 kiloOhms to 100 MegaOhms.

4. The thermal field emission electron gun of claim 3, wherein the current-limiting resistor comprises a ceramic rod having a surface with resistive material thereon and metal terminals.

5. The thermal field emission electron gun of claim 3, wherein the current-limiting resistor is encapsulated in a glass envelope with conductive terminals.

6. A method of operating a thermal field emission electron gun, the method comprising:
applying power across a filament including a thermal field emission cathode tip within a high-vacuum chamber;
applying a high-voltage difference between the filament and a suppressor electrode within the high-vacuum chamber, wherein the suppressor electrode is at a negative voltage potential in relation to the filament;
applying a high-voltage difference between the filament and an extraction electrode within the high-vacuum chamber, wherein the extraction electrode is at a negative voltage potential in relation to the filament; and
reducing arcing within the high-vacuum chamber by way of a current-limiting resistor in series with the suppressor electrode,
wherein the current-limiting resistor is a vacuum-compatible resistor positioned within the high-vacuum chamber.

7. The method of claim 6, wherein the vacuum-compatible resistor comprises a glass-encapsulated or uncoated ceramic resistor.

8. The method of claim 6, wherein the current-limiting resistor has a resistance in a range of 100 kiloOhms to 100 MegaOhms.

9. The method of claim 6, wherein the thermal field emission electron gun is used in a scanning electron microscope apparatus.

10. An electron generating apparatus comprising:
means for applying power across a filament including a thermal field emission cathode tip within a high-vacuum chamber;
means for applying a high-voltage difference between the filament and a suppressor electrode within the high-vacuum chamber, wherein the suppressor electrode is at a negative voltage potential in relation to the filament;
means for applying a high-voltage difference between the filament and an extraction electrode within the high-vacuum chamber, wherein the extraction electrode is at a negative voltage potential in relation to the filament; and
means for reducing arcing within the high-vacuum chamber comprising a current-limiting resistor in series with the suppressor electrode,
wherein the current-limiting resistor is a vacuum-compatible resistor positioned within the high-vacuum chamber.

11. The apparatus of claim 10, wherein the vacuum-compatible resistor comprises a glass-encapsulated or uncoated ceramic resistor.

* * * * *